(12) United States Patent
Cane et al.

(10) Patent No.: US 7,476,802 B2
(45) Date of Patent: Jan. 13, 2009

(54) PROGRAMMABLE AUTOMATION CONTROLLER ASSEMBLY

(75) Inventors: Gary R. Cane, Phoenixville, PA (US); Brian M. Callahan, Columbia, MD (US); James R. Iocca, Conshohocken, PA (US); Steve D. DiBona, Drexel Hill, PA (US); Andres Lebaudy, Bryn Mawr, PA (US)

(73) Assignee: Fairmont Automation Inc., Newton Square, PA (US)

( * ) Notice: Subject to any disclaimer, the term of this patent is extended or adjusted under 35 U.S.C. 154(b) by 0 days.

(21) Appl. No.: 11/085,232

(22) Filed: Mar. 22, 2005

(65) Prior Publication Data

US 2005/0248925 A1 Nov. 10, 2005

Related U.S. Application Data

(60) Provisional application No. 60/544,915, filed on Mar. 22, 2004.

(51) Int. Cl.
*H01J 5/00* (2006.01)
(52) U.S. Cl. .............................. 174/50; 174/59; 174/60; 174/61; 361/737
(58) Field of Classification Search ................... 174/50, 174/59, 60, 61, 51; 361/737, 724, 600
See application file for complete search history.

(56) References Cited

U.S. PATENT DOCUMENTS

| 2,028,509 | A | * | 1/1936 | Knell ......................... 220/3.94 |
| 2,871,457 | A | * | 1/1959 | Jencks et al. ................. 439/370 |
| 3,823,973 | A | * | 7/1974 | Ramer ...................... 294/68.26 |
| 5,747,734 | A | * | 5/1998 | Kozlowski et al. ............ 174/50 |
| 6,301,095 | B1 | * | 10/2001 | Laughlin et al. ............. 361/624 |
| 6,362,425 | B1 | * | 3/2002 | Chilton et al. ................ 174/51 |
| 6,449,732 | B1 | * | 9/2002 | Rasmussen et al. ........... 714/12 |
| 6,742,136 | B2 | | 5/2004 | Christensen et al. |
| 6,754,846 | B2 | | 6/2004 | Rasmussen et al. |
| 6,754,885 | B1 | | 6/2004 | Dardinski et al. |

* cited by examiner

*Primary Examiner*—Dhiru R Patel
(74) *Attorney, Agent, or Firm*—Blank Rome LLP

(57) ABSTRACT

A programmable logic controller or programmable automation controller assembly that can be used in harsh environments. A plurality of user-configurable housings are used to accommodate a customer's desired functionality design. A two-board design is featured to enable electronics in the controller assembly. The two-board design includes an active board that houses a majority of electrical components in the controller assembly, and a wiring hub that is used for wiring terminations. A mechanism is provided for a field-removable labeling system that withstands harsh environmental conditions.

28 Claims, 8 Drawing Sheets

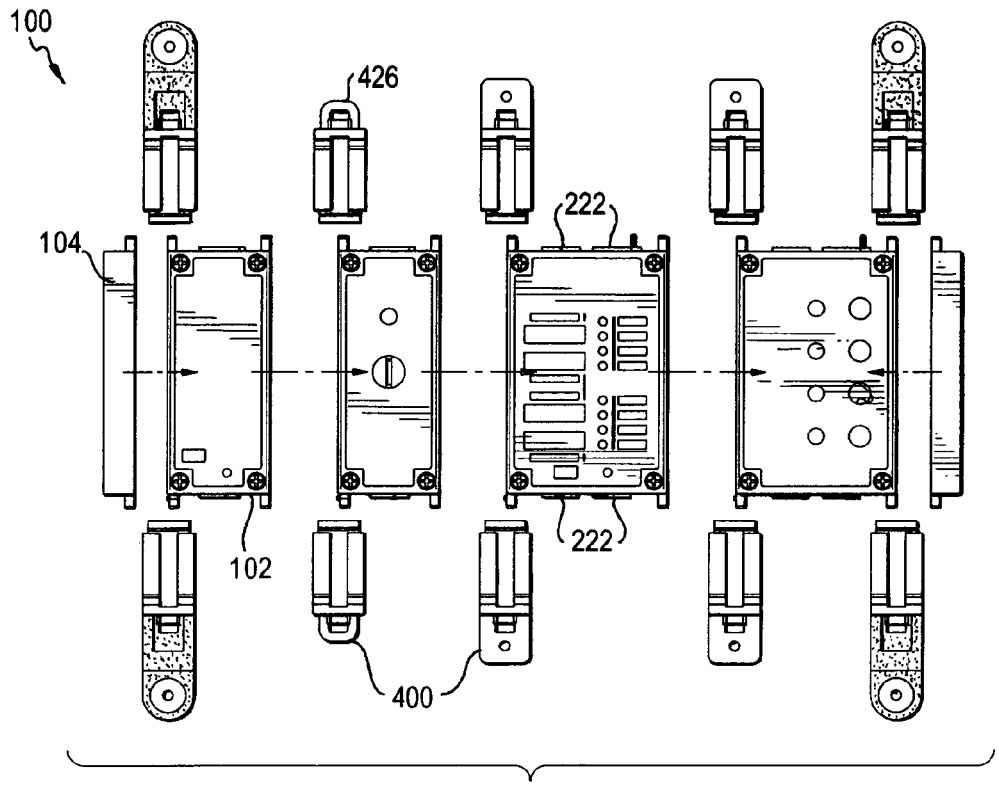
FIG. 3
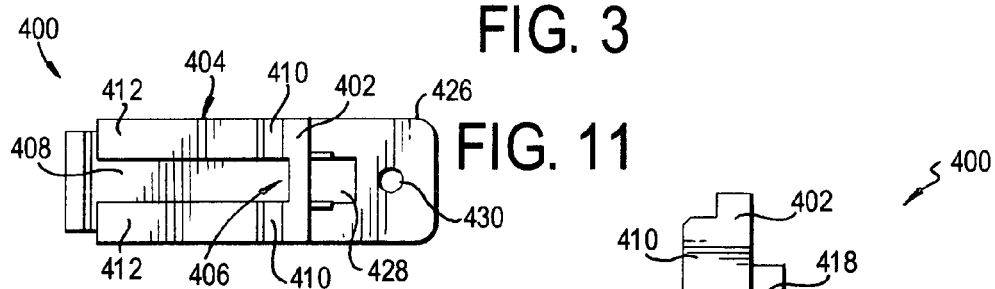
FIG. 11
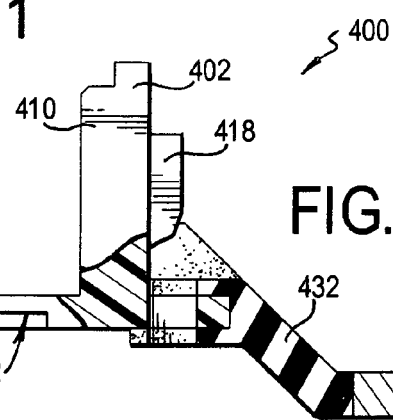
FIG. 13
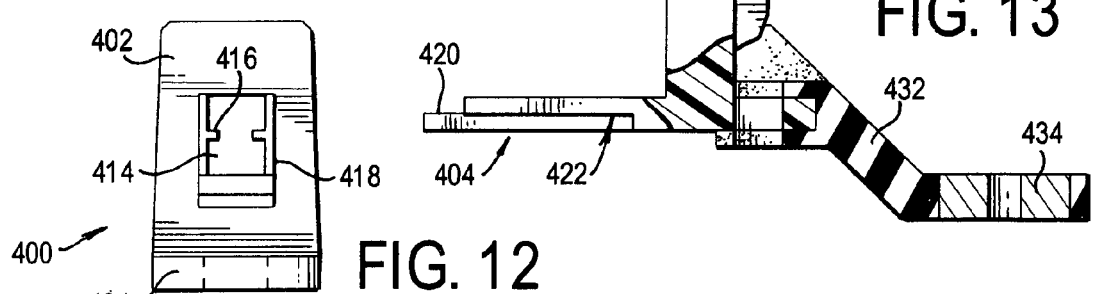
FIG. 12
FIG. 16
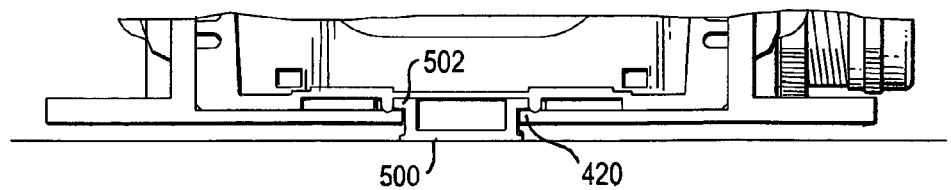

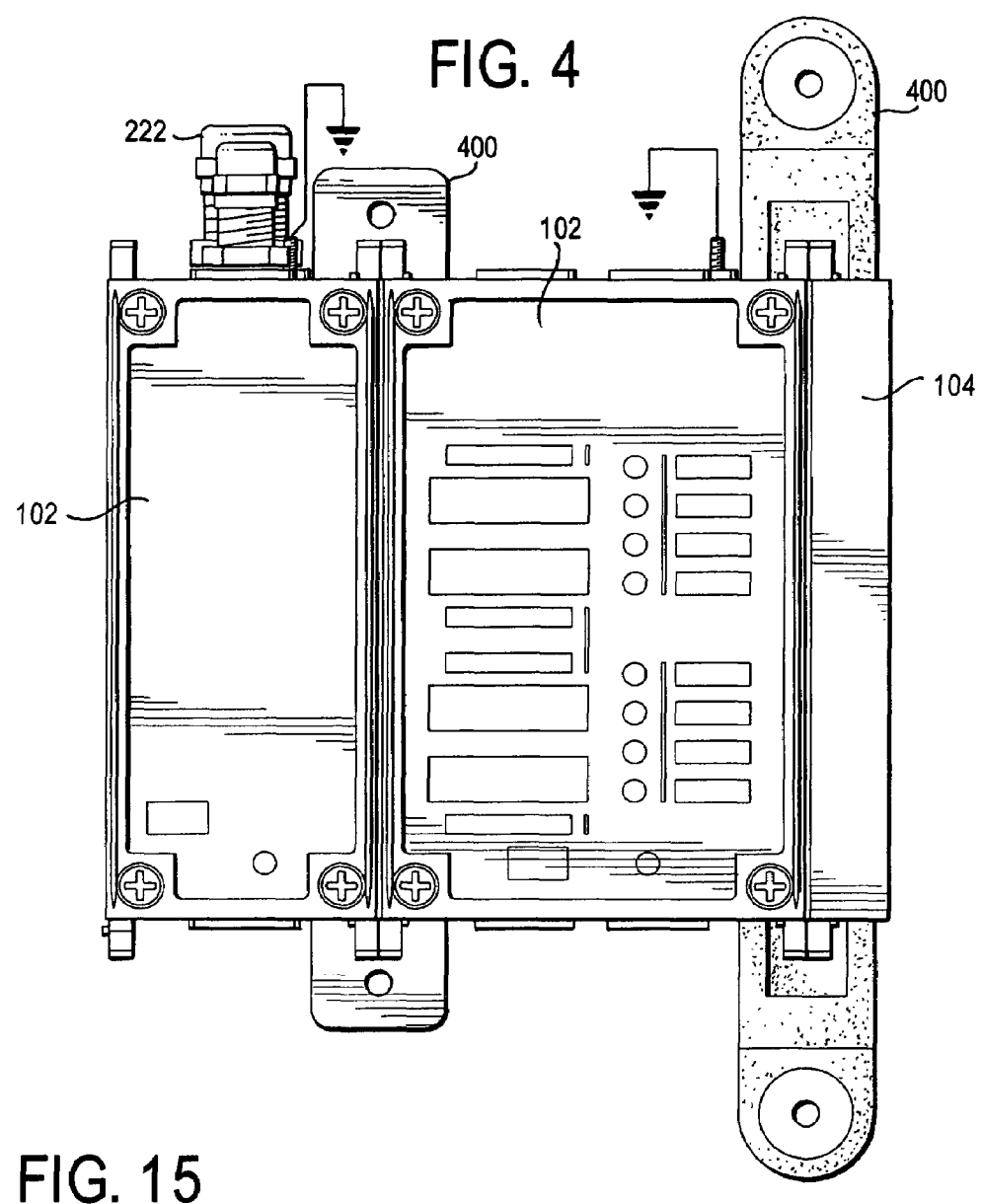
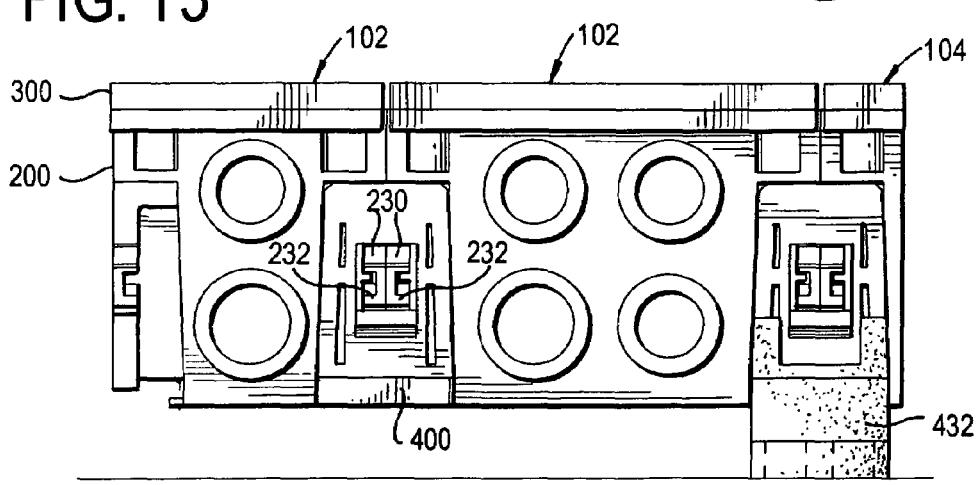

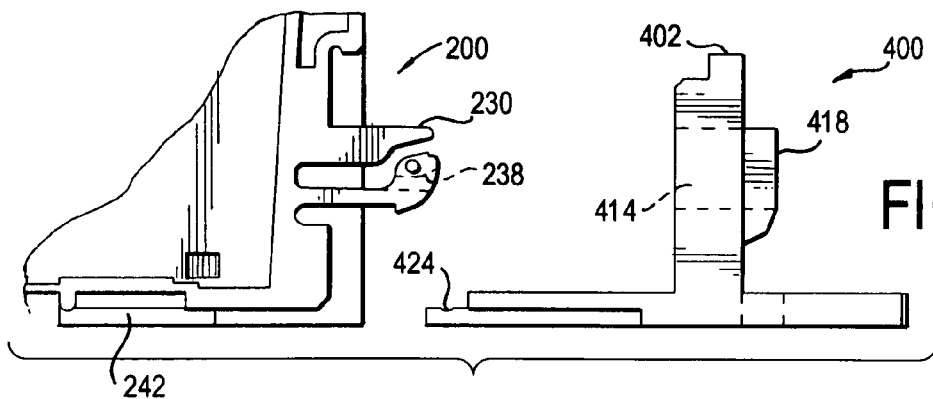
FIG. 14A
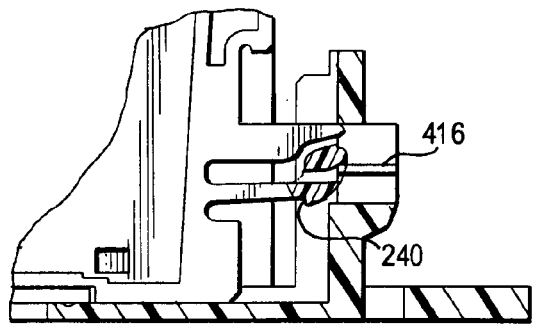
FIG. 14B
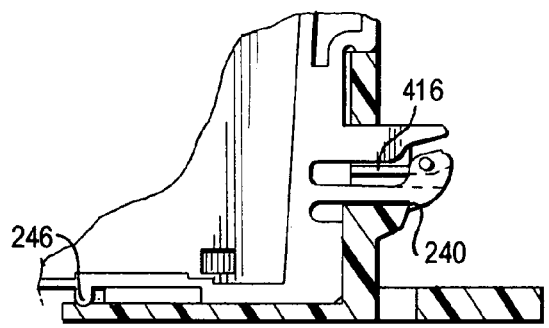
FIG. 14C
FIG. 9
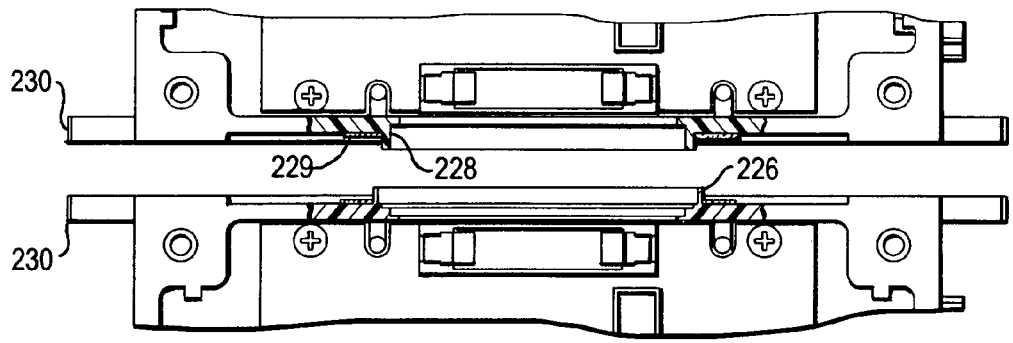
FIG. 10
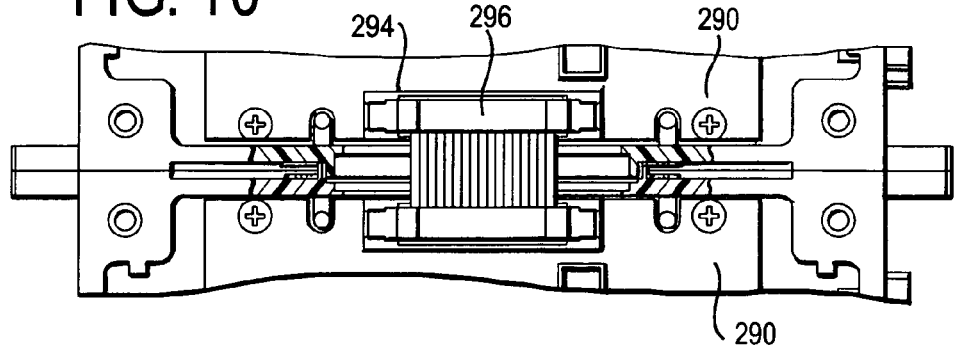

PROGRAMMABLE AUTOMATION CONTROLLER ASSEMBLY

RELATED INVENTIONS

The present application claims priority to U.S. Provisional Application Ser. No. 60/554,915, filed Mar. 22, 2004, the contents of which are incorporated herein by reference.

FIELD OF THE INVENTION

The present invention is generally related to programmable logic controllers and, more particularly, to an apparatus and method for a multi-purpose programmable logic controller that can be used in harsh environments.

BACKGROUND OF THE INVENTION

In order for most programmable logic controllers (PLCs) or programmable automation controller (PAC) to function in harsh environments they are required to be repackaged in a box similar to the one shown in FIGS. 1, 2a and 2b. Those boxes need the user to custom design the internal layout including wire ways, PLC mounting, wire penetrations, etc. In addition, PLC environmental specifications given by the manufacturer are typically listed for an open space with free-flowing air. Many of those specifications become invalid when the device is confined to a sealed box (for example the temperature specification must be de-rated, shock and vibration specifications are unknown, etc.).

However, the designer of the repackaged device must endure the cost to retest each appropriate specification to ensure the product will function as expected in harsh environments, and the cost of repackaging the standard PLC enclosure into a second rugged enclosure to obtain both the required functionality features of the user and to withstand the harsh environmental conditions. There is also the added disruption to in-place field wiring and the down-time involved when replacing the internal wiring and electronics due to an electrical failure or change in user design. Thus, a need exists in the art to address these deficiencies and inadequacies and others.

SUMMARY OF THE INVENTION

The present invention provides an apparatus and method for a programmable logic controller that can be suitable for harsh environments. Briefly described in architecture, a preferred embodiment of the apparatus, among others, can be implemented as follows. The present invention includes at least one user-configurable module positioned in a multi-purpose harsh environment enclosure housing. The module includes a two-board design, an active board and a wiring hub, housed in the environs of the enclosure packaging in a design that reduces the disruption to in-field wiring and minimizes system downtime.

A plurality of user-configurable modules are housed in an assembly that includes two sealed end caps. Sealing gaskets are used on all surfaces where the modules join together. The active board is positioned on the inside face of the front cover of the housing. The wiring hub is located in the main body of the housing. The outside face of the front cover can be adapted to include various interface devices as desired by the design of the user. A label pocket that endures harsh environments is located on the outside face of the front cover of the enclosure.

The present invention also provides a method for building the programmable logic controller. In that regard, one embodiment of such a method, among others, can be broadly summarized by the following steps: housing a plurality of user-configurable modules in an enclosure adapted to withstand harsh environments; locating an active electrical board on the inside face of the front cover of the enclosure; locating the wiring hub in the main body of the user-configurable module; and providing a label pocket on the outside face of the front cover of the enclosure that can withstand harsh environmental conditions.

Other systems, methods, features, and advantages of the present invention will be or become apparent to one with skill in the art upon examination of the following drawings and detailed description. It is intended that all such additional systems, methods, features, and advantages be included within this description, be within the scope of the present invention, and be protected by the accompanying claims.

BRIEF DESCRIPTION OF THE DRAWINGS

Many aspects of the invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

FIG. 3 is an exploded view of a preferred embodiment of the invention;

FIG. 4 shows the assembly connected;

FIG. 9 is a top cutaway view of two adjacent housings being brought together;

FIG. 10 is a top cutaway view of two adjacent housings brought together;

FIG. 11 is a top view of a foot;

FIG. 12 is a side view of a foot;

FIG. 13 is a side view of a shock-mounting foot;

FIGS. 14a-c are side cutaway views showing the foot being joined to the base;

FIG. 15 is a side view of the housings connected together with the feet;

FIG. 16 is a side cutaway view of the din rail used in the assembly;

DETAILED DESCRIPTION OF THE PREFERRED EMBODIMENT

Turning to the drawings, FIG. 3 shows the controller assembly 100 of the present invention. The controller assembly 100 generally includes one or more modules or housings 102 and end caps 104. All of the interlocking parts are keyed to ensure they can only be assembled one way, which makes the assembly and maintenance of the controller assembly 100 very simple, yet rugged and able to withstand harsh environments. Any number of housings 102 can be added or removed from the controller assembly 100 on an as-needed basis. Accordingly, the size of the controller assembly 100 is modified based on the number of housings 102 that are mounted to one another based on the particular needs of the application. The two end caps 104 seal the left and right side of the assembly 100.

Figure 1:
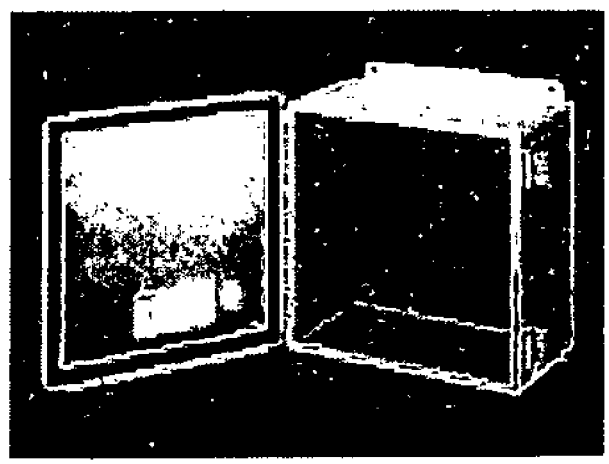
FIG. 1 is a perspective view of a controller assembly in accordance with the prior art.
Figure 2A:
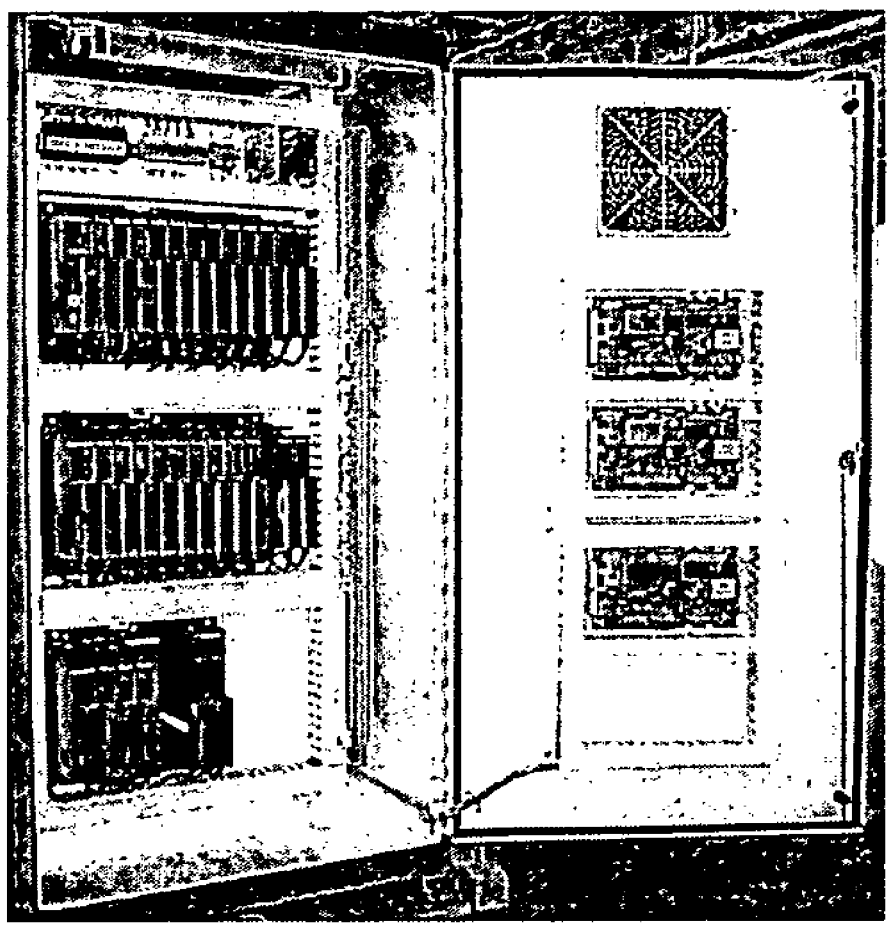
FIG. 2 is a perspective view of an enclosure in accordance with the prior art.
Figure 2B:
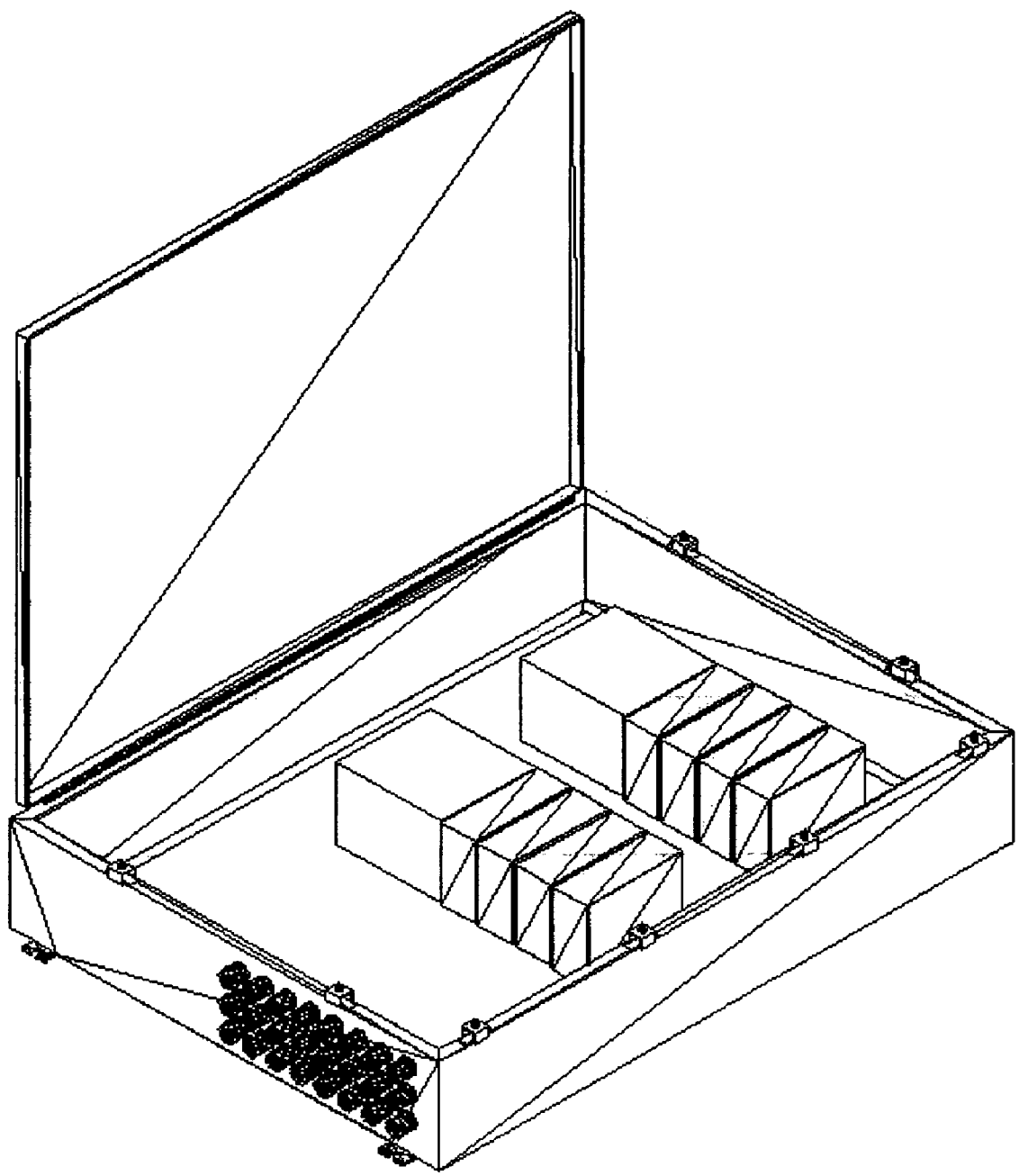
Figure 5:
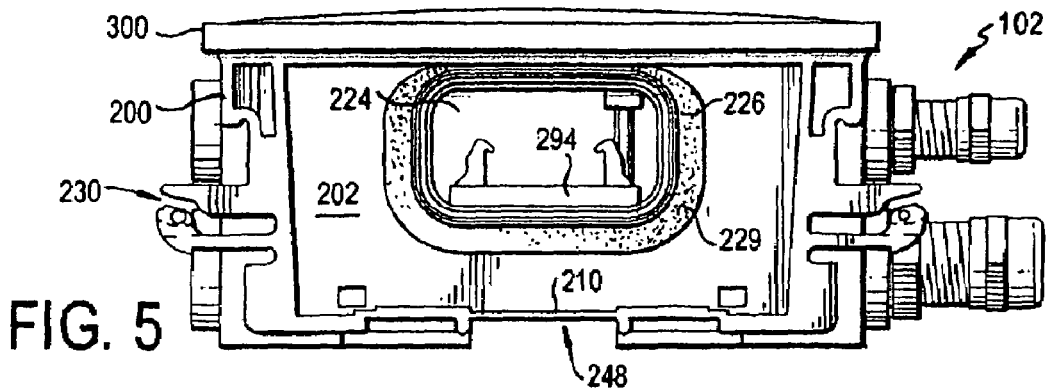
FIG. 5 is a side view of the housing.
Figure 6:
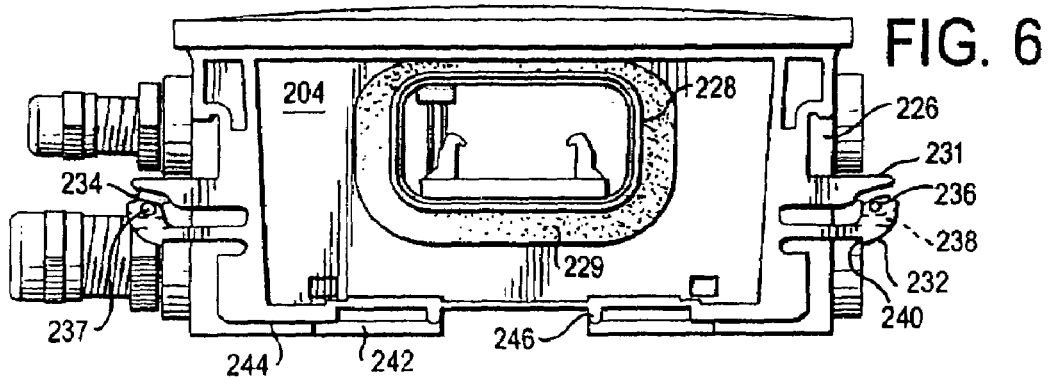
FIG. 6 is a side view of the housing at an opposite side of that shown in FIG. 5.
Figure 7:
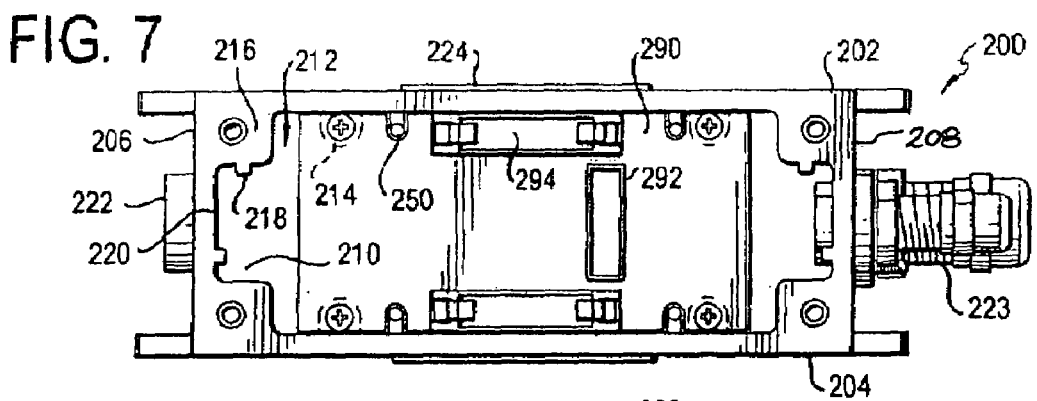
FIG. 7 is a top view of the base.
Figure 8:
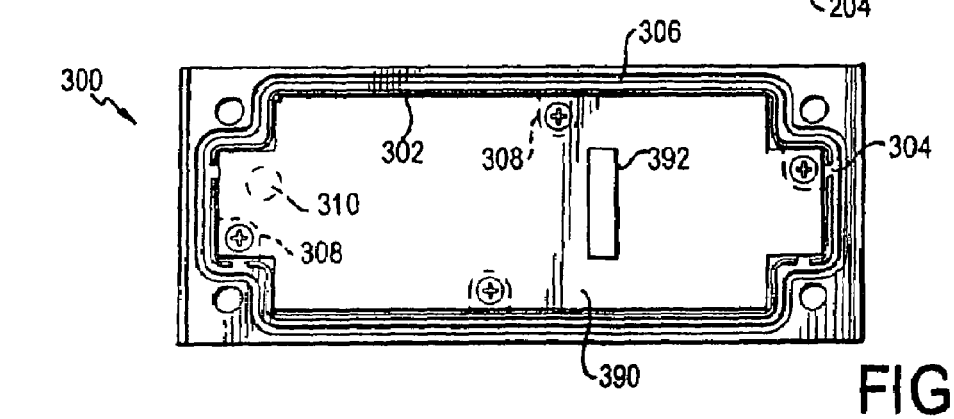
FIG. 8 is a view of the underside of a cover.

As best shown in FIGS. 5-6, the housings 102 each have a base 200 (FIG. 7) and a cover 300 (FIG. 8). The housings 102 are constructed of a hard polymer to withstand rugged environments and form a watertight enclosure. An external grounding pin is provided to ground any metal fibers present in the material. Turning to FIG. 9, the base 200 is formed of a single-molded piece having side walls 202, 204, a top wall 206, a bottom wall 208, and a bottom 210, all of which define an interior space 212. In accordance with the preferred embodiment, the base 200 receives a board 290 having chips and other electrical components mounted to it including a connection port 292. The board 290 is mounted to the base 200 by four screws that each pass through the board 290 and are removably received by respective support mounts 214 that extend upward from the bottom 210 of the base 200. The support mounts 214 elevate the board 290 from the bottom 210 of the base 200 so that wires or other components can be located beneath the board 290, if needed.

Posts 216 are formed at the corners of the base 200 to form tabs 220 with projections 218 that extend inwardly into the tabs 220. The posts 216 receive a screw that extends through an opening in the cover 300 to removably secure the cover 300 to the base 200. Openings 222 (preferably threaded) are provided in the top and bottom walls 206, 208 that are fitted with watertight cable glands (also called wire penetrations) 223 that allow cables to extend from the exterior of the base 200 to the interior of the base 200 where they can connect with the electrical components on board 290 and/or 390 (FIG. 8).

The side walls 202, 204 have generally rectangular-shaped openings 224 which permit wires, such as a ribbon connector 296 (FIG. 10), to pass between adjacent housings 102 that are joined together. Referring to FIGS. 5, 6, 9 and 10, a female flange 226 is provided about the circumference of the opening 224 on one of the side walls 202, and a male flange 228 is provided about the circumference of the opening 224 of the other side wall 204. The female flange 226 preferably has several steps, with the outer step being larger than the male flange 228 so that it surrounds the male flange 228 and forms a watertight seal with a gasket 229 adhered about the opening 224 of the male flange 228. The male flange 228 seats with an inner step of the female flange 226.

As best shown in FIGS. 5 and 6, the base 200 has a male locking mechanism 230 formed by an upper locking member 231 and a lower locking member 232. The locking members 231, 232 extend outward from recessed portions 226 at the outside corners of the base 200. The locking members 231, 232 have longitudinal axes that are substantially parallel to one another. The members 231, 232 are elongated in shape and form a channel 234 therebetween that bends toward the distal ends of the members 231, 232. The lower locking member 232 is relatively thin so that it is rigid yet somewhat flexible and can be displaced upward toward the upper locking member 231 and into the channel 234 with pressure.

The inner surface of the head of the lower locking member 232 has a slot 238 extending the entire width of the head. A pin 236 or hole 237 is located at the outward-facing surface of the head of the lower locking member 232. A lip 240 is fashioned at the bottom of the head of the lower locking member 232. The recessed portion 226 extends to the bottom of the base 200. A first guide member 242 extends over a section of the recessed portion 226 leading up to a rib 246. A second guide member 244 extends down past a section of the recessed portion 226 at the corner of the base 200.

Referring momentarily back to FIG. 3, feet 400 are provided to join adjacent housings 102 to each other or to join an end cap 104 to a housing 102. FIG. 4 shows two housings 102 and an end cap 104 joined together by feet 400. Various types of feet 400 can be provided, such as din-rail mounting feet 400 (the second set of feet to the left in the embodiment of FIG. 3), standard mounting feet 400 (FIG. 11 and FIG. 12, and the second and third set of feet from the right in the embodiment of FIG. 3), or shock and vibration absorbing feet 400 (FIG. 13, and the leftmost and rightmost feet in the embodiment of FIG. 3). The feet 400 have two arms 402, 404 that are substantially perpendicular to one another to form a general L-shape configuration.

A channel 406, 408 is located down the center of each arm 402, 404, forming bosses 410 and platforms 412, respectively. The upright arm 402 has a passage 414 with locking tabs 416 projecting inwardly toward each other. The feet 400 are single molded pieces, and the upright arm 402 is slightly tapered (so that it is larger at the bottom than at the top) to facilitate removal from the mold during the manufacturing process. The locking tabs 416 extend the entire width of an extension member 418 up to the start of the bosses 410. A lip 420 extends outwardly from the platform 412 at the distal end of the guide arm 404. A notch 422 is cut along the bottom of the guide arm 404 so that the platforms 412 partly extend outward, and such that the lip 420 is narrower than the platforms 412 (FIG. 11). The lip 420 has a curved indent 424 (FIG. 14a) that extends the width of the lip 420. A pull 426 extends outwardly from the bottom of the upright arm 402.

A release opening 428 and hole 430 are located in the pull 426. The hole 430 receives a fastener to secure the controller assembly 100 to a wall or other structure. For the shock feet 400 (FIG. 13), a fastening member 432 is provided having a metal fastening ring 434. The fastening member 432 is adhered to the pull 426 and is formed of rubber to cushion shocks or impacts on the controller assembly 100. The metal fastening ring 434 has a hole used to receive a fastener to mount the controller assembly 100 to a wall or other structure.

Turning to FIGS. 14a-c, the use of the feet 400 to join the housings 102 and end caps 104 will be discussed. First, referring momentarily to FIG. 9, the two housings 102 that are to be joined are aligned and brought together. As depicted in FIG. 10, the male locking mechanisms 230 come together and the pin 236 (shown in FIGS. 5, 6) in the lower locking member 232 of one locking mechanism 230 engages the hole 237 of the lower locking member of the other locking mechanism 230.

One of the feet 400 is then aligned with the combined housings 102. The guide 242 (FIG. 14a) aligns with the bottom of the platform 412 so that the guide 242 slides into the notched area 422 of the guide arm 404, FIG. 14b. And, the guide 244 enters the channel 408 of the guide arm 404. As the foot 400 is fully received by the base 200, FIG. 14c, the rib 246 enters the indent 424. This operation keeps the guide arm 404 firmly in place on the bottom of the base 200. It also aligns the male locking mechanism 230 with the passage 414 of the upright arm 402. As the foot 400 is positioned on the base 200, FIG. 14b, the arms 231, 232 of the male locking mechanism 230 enter the passageway 414 of the foot 400. The head of the lower locking member 232 is curved, so that the bottom of the passage 414 pushes the lower locking member 232 upward, while the upper locking member 231 engages the top of the passage 404 to prevent the foot 400 from moving upward. Once the members 231, 232 pass through the passageway 414, the lip 240 passes beyond the passageway 414 so that the lower member 232 springs downward. The lip 240 mates with the end of the extension 418 to lock the foot 400 to the base 200, FIG. 14c.

In a preferred embodiment, the passageway 414 has locking tabs 416 which further lock the foot 400 to the base 200. As shown in FIG. 14b, the locking tab 416 engages the top of the slot 238, which is curved upward toward the end of the lower locking member 232. The tab 416 pushes the lower locking member 232 upward and continues to slide through the slot 238. Once the members 231, 232 pass through the passageway 414, the locking tabs 416 pass beyond the passageway 414. The lower locking member 232 springs downward so that the locking tabs 416 mate with the inside of the head of the lower locking member 232, FIG. 14c.

Thus, the male locking mechanism 230 and passageway 414 form a high-strength snap that operates to removably engage the mounting feet 400 to the base 200. Once the foot 400 is in place, the bosses 410 and platforms 412 are received in the recessed portion 226 of the base 200. Accordingly, the foot 400 is substantially flush with the surface of the top and bottom walls of the base 102 or end cap 104, FIGS. 14c, 15. In addition, the channel 408 is slightly wider (about $1/16^{th}$ of an inch) at the distal end of the guide arm 404 than at the proximal end of the guide arm 404. Thus, as the foot 400 slides onto the male locking mechanism 230, the channel 408 squeezes the guides 244 of the adjacent bases 200 closer to one another so that a tight fit is made between the housings 102 being connected and a watertight seal is made. It should be noted that the housings 102 and cap 104 can engage one another in any suitable manner so that the locking mechanism 230 engages the passageway 414 as the guide arm 404 is slidably received at the bottom of the base 200.

To remove the mounting feet 400 from the housing 102, a shaft, for example a screwdriver, is used. The screwdriver is inserted into the release opening 428 of the foot 400 at an angle and then is leveraged toward the housing 102 to pry the mounting feet 400 apart from the housing 102. This prying action does two things: it squeezes the lower locking member 232 upward so that the male locking mechanism 230 can fit back through the passageway 414. In addition, the lip 240 and locking tabs 416 become disengaged from the extension 418 and head of the lower locking member 232, respectively. At the same time, it pulls the mounting feet 400 away from the housing 102. The user can then insert the screwdriver at the top of the foot 400 to further pry it away from the housing 102, or can pull on the pull 426 to fully remove the foot 400.

Turning to FIG. 16, a din rail 500 can also be provided as an alternative way to secure the assembly 100 to a wall or structure. The din rail 500 is an elongated metal rail having a general U-shape configuration with upright arms having bent ends forming tongues 502. The din rail 500 has openings along its length that receive fasteners used to secure the din rail 500 to a wall or structure. The lip 420 of the feet 400 form a ledge that slidably receive the tongues 502 along the length of the assembly 100. The din rail 500 fits within a groove formed in the bottom of the base 200 across all of the housings 102 and end caps 104. Accordingly, after the din rail 500 is mounted to the wall, the assembly 100 is slid onto the din rail 500 so that the tongues 502 engage the grooves created between the lip 420 and the bottom of the base 200.

As shown in FIG. 3, the outside face of the front covers 300 may include user interface devices, such as displays, keypads, switches, and labels. Thus, the repackaged box face becomes available to mount user interface components. Those interface components can be selected by the customer and can be independent of the device provided by the PLC manufacturer. Accordingly, the housings 102 can be configured by the user to include any desired switches, dials, displays, etc. to the cover 300.

Turning to FIG. 8, the bottom or interior side of the cover 300 is shown. The cover 300 provides access to the interior space 212 of the base 200. The cover 300 has a thin upright wall 302 forming an inner circumference. The wall 302 aligns with the outer circumference of the interior space 212 of the base 200 to align the cover 300 with the base 200. Notches 304 are provide in the wall 203 aligned with the projections 218 in the base 200. The notches 304 and projections 218 are arranged differently on the opposite sides of the housing 102, so that the cover 300 only fits onto the base 200 one way and cannot be inverted. An annular groove 306 is provided about the wall 302 to receive a sealing material such as a rubber ring to form a watertight seal between the cover 300 and the base 200.

The cover 300 is used to retain electronics, preferably a board 390 having electronic components including a connection port 392. The board 390 is fastened to the underside of the cover 300 by screws that pass into posts 308 in the cover 300. The posts 308 separate the board 390 from the cover 300 to accommodate any electronics on the board 390. An opening like 310 can be provided in the cover 300 so that wiring can pass from the exterior to the interior of the cover 300 to connect the components on the face of the cover 300 with the board 390 or to view display elements, for example LEDs, on the active board 390 through the cover 300.

Figure 17:
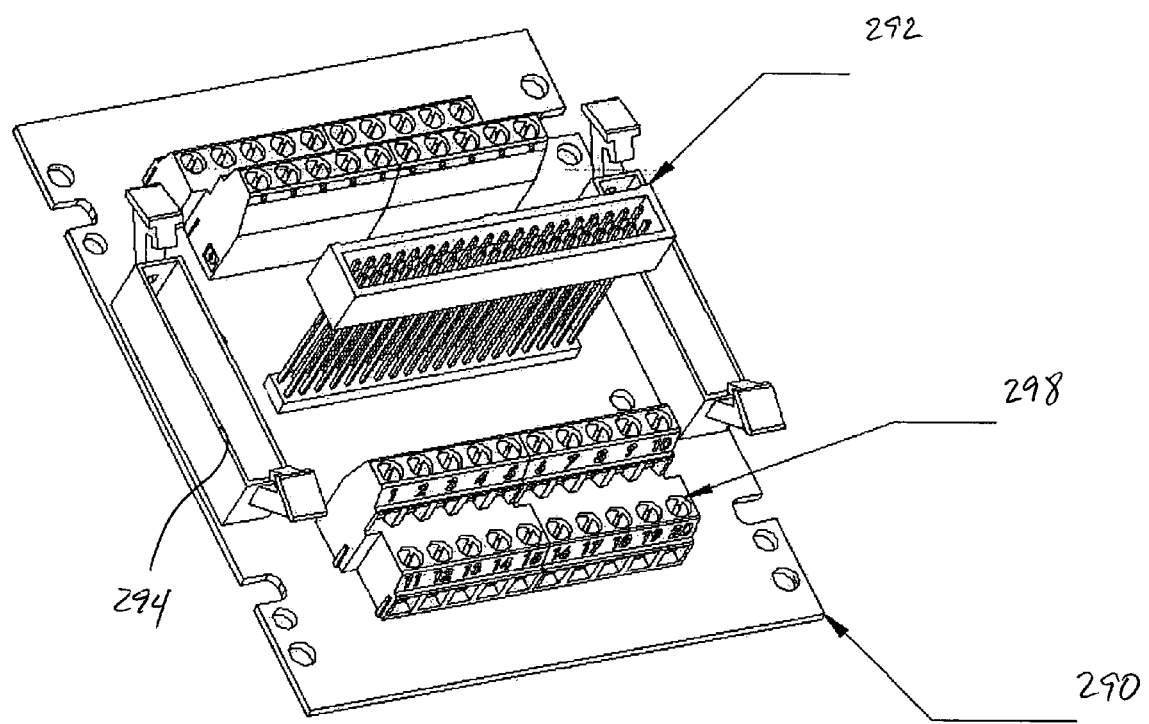
FIG. 17 is a view of the wiring hub.

In accordance with a preferred embodiment of the invention, the board 390 that is mounted to the underside of the cover 300 is an active board, and the board 290 located in the base 200 is a wiring hub. The wiring hub board 290 has a connection port 292 that connects with the connection port 392 of the active board 300. The connection port 292 preferably includes elongated pins (FIG. 17) that are affixed to the connection port 292 and extend from the wiring hub 290 to the active board 390. Accordingly, as the cover 300 is placed on the base 200, the wall 302 aligns the boards so that the connection port 392 mates with the elongated pins of the connection port 292 to form a connection therebetween.

The majority of electrical components found in the housing 102, such as microprocessors, memory, and power circuits, are located on the active board 390. The active board 390 may also include a display to interface with the user through the face of the front cover 300. Since the components located on the active board 390 are generally complex and will have the highest probability of failure, they are located on the cover 300. Thus, if those components fail, the user simply needs to replace the cover 300 or that board 390 and the wiring hub 290 will remain intact.

The wiring hub board 290 can be thought of as the interface for the active board 390. The components found on the wiring hub 290 are mainly connection points 298 that field wiring can be attached to that enter the housing 102 through the wiring glands 222. During installation, the wiring hub 290 can be held in the installer's hand to make the task of connecting wires to the terminals easier. In addition, staging posts 250 having a ledge are provided to hold the wiring hub 290 in place. The hub 290 has openings that are positioned over the staging posts 250 so that the board 290 rests on the ledge during wiring. When the wiring is complete, the wiring hub 290 is slid down the staging posts 250 and is secured to mounts 214.

In addition, the wiring hub 290 includes terminal wiring strips 298 that add junction box/connection panel functionality to the assembly 100. The terminal wiring strips receive separate field wires that need to be joined and connect them in a weather proof, clean manner. For example, field wires A, B, and C can be connected together by bringing them in through the wiring glands 222 and connecting them to common points on connectors 298.

In addition to ease of installation, the two-board design significantly eases maintenance procedures, costs, and time-of-recovery in the face of equipment failure. The active board 390 not only includes the vast majority of electrical components, but also includes the components that are most complex and have the highest probability of failure. If the housing 102 does experience an electrical failure, most likely only the active board 390 will need to be removed and replaced.

The two board design has several advantages, including that the process of replacing a damaged active board 390 is completed without disrupting the in-place field wiring that is secured to the wiring hub 290. The operator can simply remove the front cover 300, unscrew the active board 390 from the underside of the cover 300 and replace the active board 390 with a new one without disengaging and reengaging any wiring connections. Alternatively, the use can simply replace the entire cover 300 with a new cover 300 having a new active board 390. In addition, the connectors are a large percentage of the cost of a device, hence this cost can be eliminated from the replacement process. The cost and space required to maintain spares are also reduced as only the slim-profile/small footprint active board 390 need be kept in inventory, and not the entire controller 100 or base 200. And, the time-of-recovery from a failure event to a functioning repaired controller 300 is reduced.

When the front covers 300 are delivered to the customer, none of the programmable user interface objects are assigned to a particular function. As such, the customer must label each of the objects as the job demands. In this sprit, a removable labeling system that is as rugged as the rest of the assembly 100 is provided. The present invention ensures that the labels endure harsh environments and remain in place in the presence of high vibration and shock.

Figure 18:
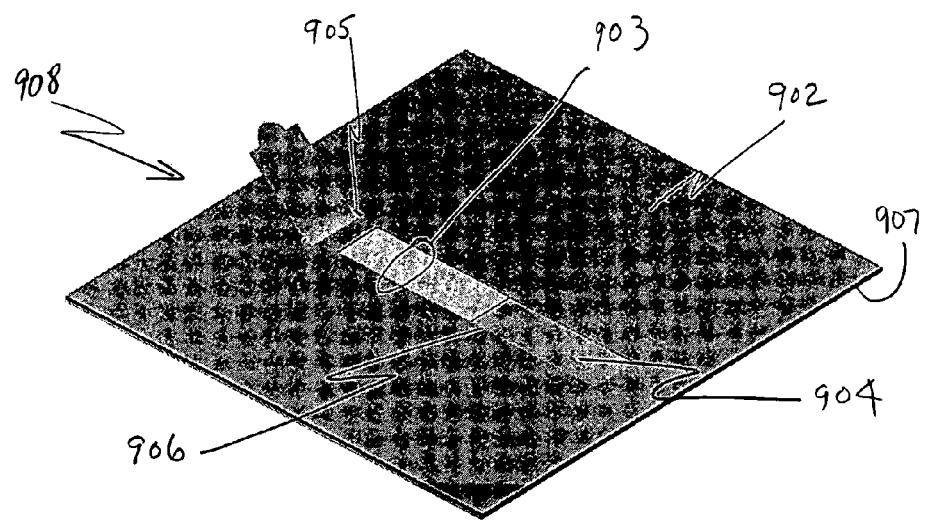
FIG. 18 shows the label used with the cover.

The labels themselves are constructed from a commercially available weather resistant card stock. When the labels are printed on a laser printer, the ink becomes waterproof and extremely durable. Referring to FIG. 18, the labels are printed on a pre-perforated sheet specially sized to fit into label pockets 906 on the front cover 300. The label pockets 906 are an integral part of a labeling overlay 908 that can be provided on each cover 300. The labeling overlay 908 is preferably constructed of layered plastic and it is that layering that allows the label pockets 906 to function.

Each labeling overlay 908 preferably includes a top first plastic layer 902, a middle second layer 907 and a bottom third layer 904. The first layer 902 is the external layer of the labeling overlay 908. The first layer 902 includes a slot 905 that the label sheet is inserted through and a window 903 to view the text on the label. The slot is wider than the width of the window 903 so that the labels are wider than the window 903 and won't fall out from the window 903. Preferably, there can be multiple windows 903 aligned vertically with one long slot 905 extending the entire height of all the windows. A single label sheet can then be used having text displayed at each of the multiple windows 903.

Figure 19:
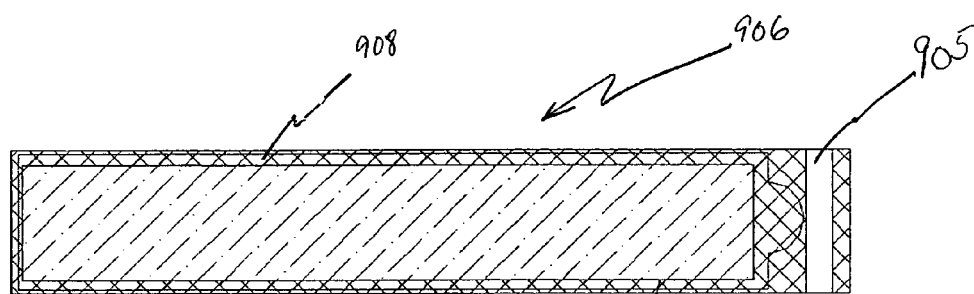
FIG. 19 shows the layers of the label.
Figure 20:
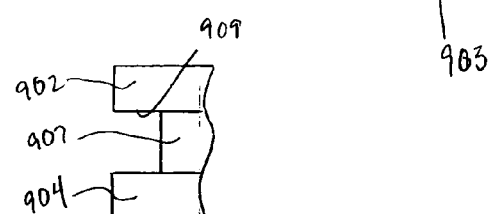
FIG. 20 is a cross-section showing the three layers of the label overlay.

A second layer 907 is adhered to the first layer 902 to operate as a spacer to provide a space for the label sheet to be inserted beneath the window 903. The spacer 907 raises the first layer 902 and accounts for the label thickness. The spacer layer 907 has cutouts that are aligned with and slightly larger about the circumference than the slot 905 and window 903 of the first layer. The height of the cutout is approximately the same as that of the slot 905. Accordingly, the second layer 907 creates a pocket 906 about the slot 905 and window 903. Referring to FIG. 19, the pocket 906 is slightly larger than the window 903 of the first layer. The spacer 907 creates the pocket 906 and raises the first layer 902 so that the label has space to be inserted between the first layer 902 and the bottom third layer 904. As best shown in FIG. 20, the first layer 902 forms a lip 909 with above the second layer 907. The lip 909 retains the label within the pocket 906

The third layer 904 is a flat black plastic with a polished finish. The third layer 904 is the bottom of the label pocket 906. The black backing is visible when no label is installed and gives the front cover 300 a contiguous appearance that is not disrupted by a color change due to an empty label pocket 906. The labels and label pockets 906 may vary in size and shape depending on the housing 102 and the section of the labeling overlay 908. However, the label system functions the same regardless of the size and shape of the labels.

To insert the printed labels into the labeling overlay 908, the printed label (text facing up) is slid into the label insertion slot 905. Once the label is installed, the shape of the label pocket 906 will keep the label from coming out due to harsh environmental conditions (i.e. hose directed water jet, high vibration, sudden shock, etc.). The label is larger in every direction than the exposed area, which makes it impossible for the label to bend and fall out of the cutout viewing section. The inherent stiffness of the paper also keeps the label from sliding back out of the label insertion slot 905. If the paper is pushed in the direction of the label insertion slot 905, it will catch under the lip on the far side of the label pocket 906. To remove the label from the label pocket 906, a guide (such as the corner of a piece of paper) is inserted into the label insertion slot 905. Then, when the label is pushed toward the label insertion slot 905, it will ride up the guide and out of the label insertion slot 905.

The control and processing of the boards are discussed in copending application entitled Modular Programmable Automation Controller with Multi-Processor Architecture, Ser. No. 11/085,605, which claims priority to provisional application No. 60/554,905, the contents of which are incorporated herein. Each housing 102 is equipped with its own processor and memory, so that processing power and memory storage capacity grows proportionally with I/O, networking and user-interface capabilities. The processing load is distributed across the housings 102, so that only the resources contained within that housing become inaccessible in the event of a failure. The boards can be configured to execute redundant algorithms, so that if one fails another can take over its control functions. There can also be redundancy in power sources, to the PLC or PAC and to the external devices that it powers. The boards share information over a common high-speed data bus, so that the hardware resources (e.g., inputs, outputs, displays, buttons, etc.) at one housing is available to all the boards.

The assembly 100 is able to withstand rugged environments, including operating ambient temperatures from −40° C. to 65° C. and storage/transport temperatures from −40° C. to 85° C., high impact shocks according to MIL-STD-901D specifications, mechanical vibrations according to MIL-STD-167B specifications, and electromagnetic interference to MIL-STD-461E specifications. Preferably, the housings 102 are available in two sizes: 4" W×6" L×3" H and 2.5" W×6" L×3"H.

It should be emphasized that the above-described embodiments of the present invention, particularly, any preferred embodiments, are merely possible examples of implementations, merely set forth for a clear understanding of the principles of the invention. Many variations and modifications may be made to the above-described embodiment(s) of the invention without departing substantially from the spirit and principles of the invention. All such modifications and variations are intended to be included herein within the scope of this disclosure and the present invention and protected by the following claims.

What is claimed is:

1. A programmable logic controller assembly, comprising:
a first housing enclosing a first electrical component and having a first fastening element;
a second housing enclosing a second electrical component and having a second fastening element; and
a first fastening member for removably engaging said first fastening element and said second fastening element to directly couple said first housing with said second housing, said first fastening element and said second fastening element each comprising elongated prong members, and said first fastening member comprising a first arm and a second arm, the first arm having an opening for removably engaging the elongated prong members.

2. The controller assembly of claim 1, said first housing and said second housing each having a side wall with an opening, the opening of said first housing aligned with and facing the opening of said second housing.

3. The controller assembly of claim 2, further comprising a gasket positioned about the opening of said first housing and the opening of said second housing to provide a seal therebetween.

4. The controller assembly of claim 1, said first housing having a first cover to enclose the first electrical component within said first housing, and said second housing having a second cover to enclose the second electrical component within said second housing.

5. The controller assembly of claim 1, said first housing having a first cover with an outside face having a third electrical component and said second housing having a second cover with an outside face having a fourth electrical component.

6. The controller assembly of claim 1, wherein the first electrical component comprises an active board.

7. The controller assembly of claim 1, wherein the first electrical component comprises a wiring hub.

8. The controller assembly of claim 1, said first housing having a first cover with an inside face having a third electrical component and said second housing having a second cover with an inside face having a fourth electrical component.

9. The controller assembly of claim 8, wherein the first electrical component comprises a wiring hub and the third electrical component comprises an active board.

10. The controller assembly of claim 9, wherein the wiring hub includes connection points that electrically connect to field wiring and the wiring hub is electrically connected to the active board.

11. The controller assembly of claim 9, said first housing including a staging post that engages the wiring hub.

12. The controller assembly of claim 1, wherein said first housing has a bottom, and the first electrical component is mounted to the bottom of said first housing.

13. The controller assembly of claim 1, further comprising an end cap sealingly engaged to said first housing.

14. The controller assembly of claim 1, the first and second arms forming a general L-shape.

15. The controller assembly of claim 1, said housing having a side with a groove for slidably receiving the second arm of said first fastening member.

16. The controller assembly of claim 1, wherein the first and second arm are compressed to fit within the opening of the first arm, and which expand upon being fully engaged in the opening.

17. The controller assembly of claim 1, said first housing and said second housing further having wire penetrations for external electrical connections.

18. The controller assembly of claim 1, wherein a labeling overlay is located on an outside face of a front cover of the first housing.

19. The controller assembly of claim 18, wherein the labeling overlay includes an integral label pocket.

20. The controller assembly of claim 19, further comprising:
a first outermost layer that includes a label insertion slot for insertion of a label sheet, and a window to view text on the label sheet;
a second middle layer adapted to accommodate a thickness of the label sheet, and cut-outs that comprise side barriers of the label pocket; and
a third bottom layer.

21. The controller assembly of claim 1, wherein the first housing is aligned in the same transverse axis with the second housing.

22. The controller assembly of claim 1, wherein the first housing and the second housing each have a side, the side of the first housing facing the side of the second housing and directly coupled thereto by the fastening member.

23. The controller assembly of claim 1, wherein the first housing and the second housing each have a side wall, the side wall of the first housing facing the side wall of the second housing and directly coupled thereto by the fastening member.

24. The controller assembly of claim 1, wherein the first fastening member couples the first fastening element with the second fastening element.

25. The controller assembly of claim 1 wherein the first fastening member is a mounting foot.

26. The controller assembly of claim 1 wherein the fastening member is adapted to absorb at least one of vibration and shock.

27. A controller assembly, comprising a first housing and a second housing, each of said first and second housings having a base and a cover, an active board having electronic components mounted to an inside face of the cover, a wiring hub having connectors for terminating field connections mounted to the base of said housing, the active board adapted to connect with the wiring hub, and an opening to permit an electrical connection to pass directly between the first housing and the second housing, and further comprising a fastening mechanism slidably, removably and directly engaging a first fastening element of the first housing with a second fastening element of the second housing, said first fastening element and said second fastening element each comprising an elongated prong member, and said fastening mechanism comprising a first arm and a second arm, the first arm having an opening for removably engaging the elongated prong members.

28. The controller assembly of claim 27, further comprising an end cap sealingly engaged to one of said first and second housings.

* * * * *